(12) United States Patent
Okamoto et al.

(10) Patent No.: US 6,731,509 B1
(45) Date of Patent: May 4, 2004

(54) METHOD FOR MOUNTING ELECTRONIC CIRCUIT CHIP

(75) Inventors: Chikashi Okamoto, Kawasaki (JP); Kazuo Takaragi, Kawasaki (JP); Kazutaka Tsuji, Kokubunji (JP); Mitsuo Usami, Kokubunji (JP); Chizuko Yasunobu, Tokyo (JP); Asahiko Sobe, Tokyo (JP); Yasuhiro Tsunemi, Tokyo (JP); Hiroyuki Yagi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/856,758

(22) PCT Filed: Nov. 26, 1999

(86) PCT No.: PCT/JP99/06595

§ 371 (c)(1),
(2), (4) Date: Sep. 15, 2001

(87) PCT Pub. No.: WO00/33249

PCT Pub. Date: Jun. 8, 2000

(30) Foreign Application Priority Data

Nov. 30, 1998 (JP) .......................................... 10-339265

(51) Int. Cl.$^7$ ................................................ H05K 7/06
(52) U.S. Cl. ...................... 361/749; 361/750; 174/254; 174/256; 174/258; 428/211; 438/107; 438/110
(58) Field of Search ................................ 361/749–751, 361/767–771; 174/254, 256, 258, 259; 257/679; 235/488, 489, 491, 492; 428/211; 340/572.1, 572.5, 572.7, 572.8; 438/107, 110; 29/830

(56) References Cited

U.S. PATENT DOCUMENTS

| 5,528,222 A | | 6/1996 | Moskowitz et al. ..... 340/572.7 |
|---|---|---|---|
| 5,689,136 A | * | 11/1997 | Usami et al. ................ 257/679 |
| 5,779,839 A | | 7/1998 | Tuttle et al. ................ 156/213 |
| 5,789,815 A | * | 8/1998 | Tessier et al. .............. 257/723 |
| 5,818,692 A | * | 10/1998 | Denney et al. ............. 361/699 |
| 6,050,622 A | * | 4/2000 | Gustafson ............... 292/307 R |
| 6,061,245 A | * | 5/2000 | Ingraham et al. ........... 361/749 |
| 6,118,072 A | * | 9/2000 | Scott .......................... 174/52.1 |
| 6,147,876 A | * | 11/2000 | Yamaguchi et al. ........ 361/766 |
| 6,154,137 A | * | 11/2000 | Goff et al. ................ 340/572.4 |

FOREIGN PATENT DOCUMENTS

| EP | 0595549 | 5/1994 |
|---|---|---|
| JP | 61-297191 | 12/1986 |
| JP | 62-25096 | 2/1987 |
| JP | 1-122982 | 8/1989 |
| JP | 2-125797 | 5/1990 |
| JP | 3-38396 | 2/1991 |
| JP | 4-354722 | 12/1992 |
| JP | 7-51391 | 6/1995 |
| JP | 8-216571 | 8/1996 |
| JP | 9-104189 | 4/1997 |
| JP | 10-315668 | 12/1998 |
| JP | 11-301148 | 11/1999 |

* cited by examiner

Primary Examiner—John B. Vigushin
(74) Attorney, Agent, or Firm—Mattingly, Stanger & Malur, P.C.

(57) ABSTRACT

In a method of mounting a planar electronic circuit chip onto a flexible sheet together with another planar electronic element, the electronic circuit part and the another electric element are selected so that the planar surface of the another electric element is greater than the planar surface of the electronic circuit chip, and the another electric element and the electronic circuit chip are mounted on the sheet so that the planar surface of the another electric element and the planar surface of the electronic circuit chip are in parallel with the sheet surface, and the planer surface of the electronic circuit chip is accommodated within the planar surface of the another electric element as viewed in a direction perpendicular to the sheet surface.

9 Claims, 6 Drawing Sheets

METHOD FOR MOUNTING ELECTRONIC CIRCUIT CHIP

TECHNICAL FIELD

The present invention relates to a technology of mounting an electronic circuit chip such as an integrated circuit chip onto a soft material such as paper.

TECHNICAL BACKGROUND

These years, electronic circuit chips such as integrated circuit chips have become thinner and thinner, and accordingly, the electronic circuit chips have been used in various configurations.

In a use condition of such an electronic circuit chip, for example, as disclosed in Japanese Laid-Open Patent No. H3-38396, a small-sized electronic circuit chip for storing data is embedded in a portable plastic card together with an element for reading data in a noncontact manner. For example, such a plastic card that personal identification data has been previously stored in the electronic circuit chip, can be used as an electronic ID card which can confirm personal identification data in a noncontact manner.

DISCLOSURE OF INVENTION

The use configuration of the above-mentioned electronic circuit chip have become prosperous. However, conventionally, materials to which electronic circuit chips are mounted have been limited to materials such as plastic cards which are hard so that it cannot be largely bent and folded. It is because if a force which can largely bend or fold the materials is exerted to the materials, the electronic circuit chips are possibly damaged due to the reason of strength thereof.

However, if an electronic circuit chip can be mounted to a material such as paper which can be largely bent or folded, the use configuration of the electronic circuit chip can be broadened, and higher convenience becomes available for people.

Accordingly, an object of the present invention is to provide a mounting method with which an electronic circuit chip is prevented from being damaged even though a soft material on which the electronic circuit chip is mounted is bent or folded.

Further, another object of the present invention is to provide an electronic circuit chip which cannot be damaged even through a soft material such as paper on which the electronic circuit chip is mounted is bent or folded.

To the end, according to the present invention, there is provided a method of mounting an electronic circuit chip onto a foldable sheet, wherein during mounting, the electronic circuit chip is prevented from being located at a position where the sheet creates a crease when it is folded in a predetermined folding manner. With this mounting method, the electronic circuit chip is located while it is avoided from being mounted at a position of a crease to which a high moment force is exerted upon folding of the sheet, thereby it is possible to prevent the electronic circuit chip from being damaged by folding the sheet.

Further, with the use of parameters required for an electronic circuit chip to be mounted on the above-mentioned sheet, a specification for the electronic circuit chip, which can prevent occurrence of damage to the electronic chip even though the sheet is folded, is provided.

BEST MODE FOR CARRYING OUT THE INVENTION

Explanation will be made hereinbelow of embodiments of the present invention.

In the following explanation of the embodiments according to the present invention, there is exemplified in such a configuration that an electronic circuit chip for storing data is mounted on a paper together with an element for reading the data from the electronic circuit chip in a noncontact manner. However, it is noted that an electronic circuit chip to be mounted may be any of those other than that mentioned above, and further, any of soft materials other paper on which the electronic circuit chip is mounted may be used if it may be largely bent or it may be folded.

Further, a thin and laterally very long sheet such a tape may be used other than a planer material. That is, it may be the one which can be rolled-up.

Explanation will be made of a first embodiment of the present invention.

Figure 1:
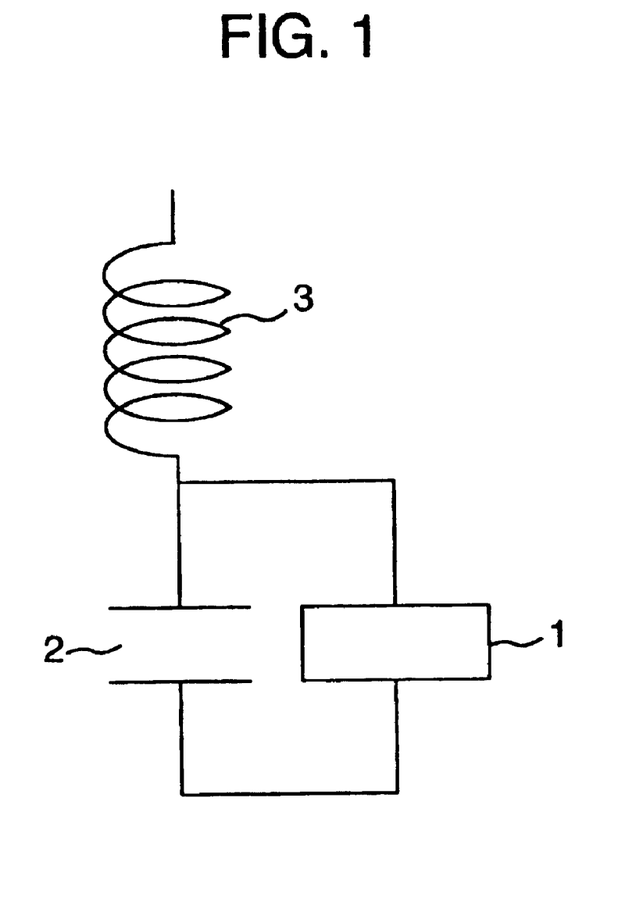
FIG. 1 is a circuit diagram illustrating a circuit using an electronic circuit chip which is mounted on paper in an embodiment of the present invention.

Referring to FIG. 1 which shows a circuit composed of an electronic circuit chip adapted to be mounted on a paper in this embodiment, and an element for reading data from the electronic circuit chip in a noncontact manner, there is shown an electronic circuit chip 1 in which electronic circuits are integrated on a silicon chip. Further, elements, that is, a capacitor 2 and an antenna 3 are elements for reading data from the electronic circuit chip 1 in a noncontact manner.

When an electromagnetic wave is applied to the above-mentioned circuit from the outside, the electromagnetic wave induces a current running through the capacitor through the antenna 3, and a power is charged in the capacitor 2. Further, the power charged in the capacitor causes the electronic circuit 1 to be energized so that data previously stored is transmitted in the form of an electromagnetic wave from the antenna 3. Accordingly, through the application of an electromagnetic wave, the data stored in the electronic circuit chip can be read on the outside thereof in a noncontact manner.

Figure 2A:
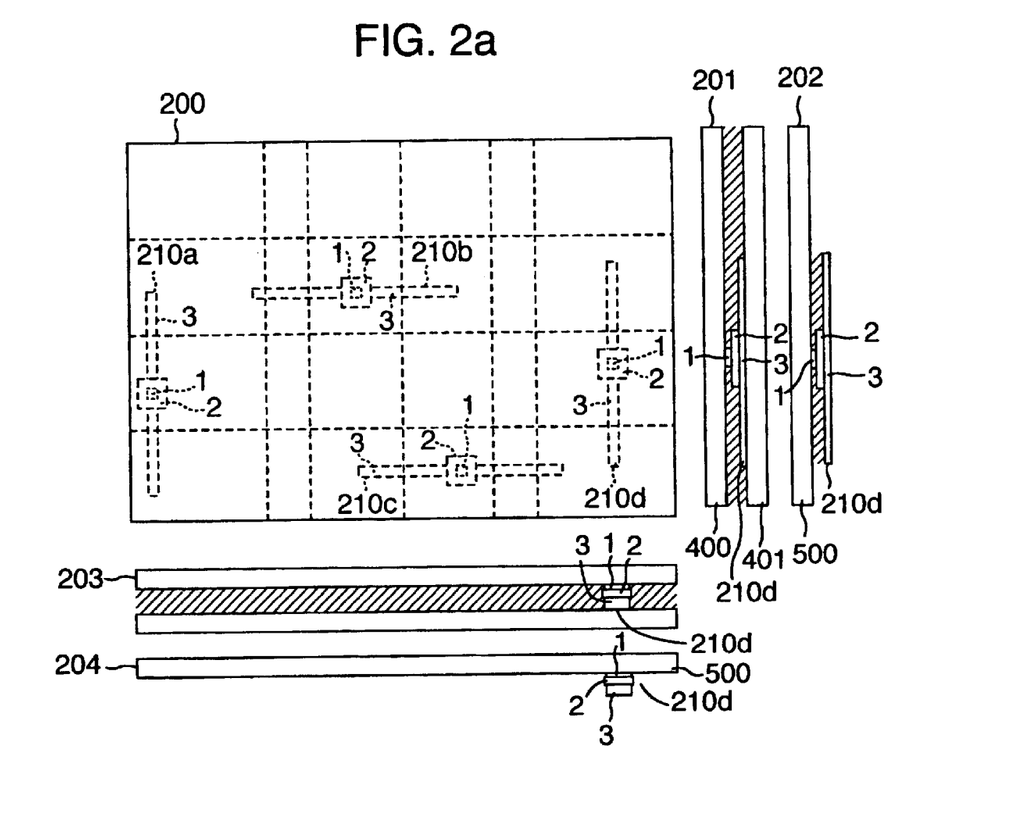
FIGS. 2a and 2b are views illustrating such a condition that a circuit using an electronic circuit chip in a first embodiment of the present invention is mounted on paper.

FIG. 2a shows a condition in which the circuit is mounted on paper, reference numeral 200 denotes the outer surface of a sheet on which the circuit is mounted. In the figure, reference numerals 210a to 210d denote configuration examples of the circuits which are mounted on a paper sheet.

It is noted here that the circuit 210d is bonded so as to be held between two sheets 400, 401 (201, 203) or a circuit 210d is bonded to a rear surface of a paper sheet 500.

Further, the circuit is mounted on the paper sheet in such a configuration that the electronic circuit chip is prevented from being mounted at a position on a crease which is created in the paper sheet, as indicated by a one-dot chain line, and a two-dot chain line in the top view 200, when the paper sheet is folded. This figure shows such an example that the paper sheet is possibly folded into ½, 1/3 or ¼ in the lateral direction thereof, and is possibly folded into ½ or ¼ in the longitudinal direction. The one-dot chain lines and the two-dot chain lines in the figure exhibit creases when the paper sheet is folded as mentioned above.

A position where a crease is possibly created so that the electronic circuit chip 1 is not located, is a position in accordance with a configuration of folding if the configuration of folding has been previously known. Further, if no configuration with which the paper is folded are previously known, a position which is one or a plurality of configurations which are usually used in various paper folding methods in accordance with kinds or uses of the paper sheet. That is, in general, the position may be on a crease which is created at any of positions obtained by 1/n of the length of the paper sheet, where n is an integer, that is, in general 2, 3, 4, 5, 6, 8, 16 in both vertical and horizontal directions, that is, positions which are +e,fra 1/2, 1/3, 1/4, 1/6, 1/8, 1/16+ee of the length of the paper sheet in each of the longitudinal and lateral directions, where a crease is possibly created, except a special kind or use of the paper sheet.

By locating the electronic circuit chip on the paper sheet, other than a position where a crease is created and where a large moment force is exerted when the paper sheet is folded, it is possible to a prevent the electronic circuit chip 1 from being damaged when the paper sheet is folded.

It is noted that the circuit 210*a* is arranged so that the electronic circuit chip 1 is located at a position in the vicinity of an edge of the paper sheet. Usually, since no large force is exerted to a position in the vicinity of an edge of the paper sheet, a degree of the force exerted to the electronic circuit chip 1 and the frequency of the exertion of the force to the electronic circuit chip 1 can be expected to be less. Alternatively, in such a case that concavities and convexities are impressed to the paper sheet for blind persons so that hard parts are formed, the electronic circuit chip 1 may be located in any of these parts since it may be expected to decrease the force exerted to the electronic circuit chip 1 located in this part.

Further, in such a case that an antenna 3 which has a strait-line like shape as a whole, as in this embodiment, the circuit is arranged so that the antenna 3 is located in parallel with a side of the paper sheet as in the configuration examples 210*a* to 210*d*. Usually, the paper sheet is bent or folded in parallel with a side of the paper sheet, and accordingly, a degree of a force exerted to the antenna 3 and the frequency of exertion of forces exerted to the antenna 3 can be expected to be less.

Further, the upper bottom surface (which is a surface in parallel with the surface) of the sheet of the electronic circuit chip 1 which is weak against a force in the bending direction, is designed so as to have a small size in order to prevent the electronic circuit chip from being exerted thereto with a large bending moment.

Figure 2B:
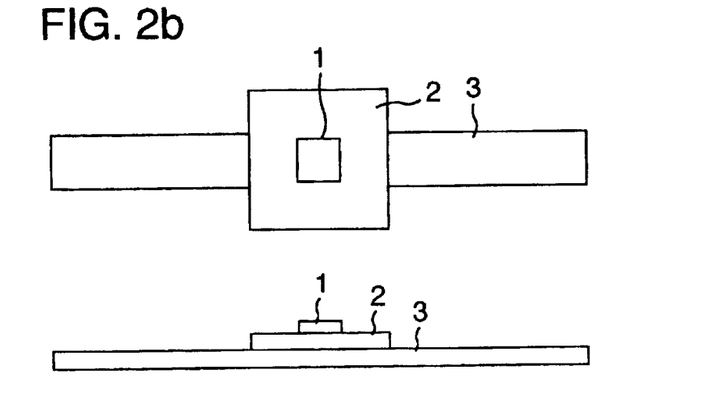

Further, as shown in FIG. 2*b* which is an enlarged view illustrating a circuit, the electronic circuit chip 1 is located on a capacitor 2 which is formed so that its upper bottom surface (which is in parallel with the surface of the paper sheet) is larger than the electronic circuit chip 1, and accordingly, the upper bottom surface of the electronic circuit chip is accommodated within the upper bottom surface of the capacitor 2 as viewed in a direction perpendicular to the surface of the paper sheet. With this arrangement, the capacitor 2 can protect the electronic circuit chip 1 from a force externally exerted. It is noted that if the upper bottom surface of the electronic circuit chip 1 is accommodated within the upper bottom surface of the capacitor 2 as viewed in a direction perpendicular to the surface of the paper sheet, the circuit may have such a structure that the antenna 3 is located between the capacitor 2 and the electronic circuit chip 1.

Explanation will be hereinbelow made of a second embodiment. Refereeing to FIGS. 3*a* and 3*b* which top views illustrating examples of configurations of circuits mounted on paper sheets, and in which 310*a* to 310*d* exhibit examples of configurations of circuits which are mounted on the paper sheets. The circuit is held between two sheets 400, 401 to which the circuit is bonded, similar to the first embodiment, as exhibited by a circuit 301*d* (301, 303). Alternatively, the circuit 310*d* is mounted being bonded to the rear surface of a paper sheet 500.

Figure 3A:
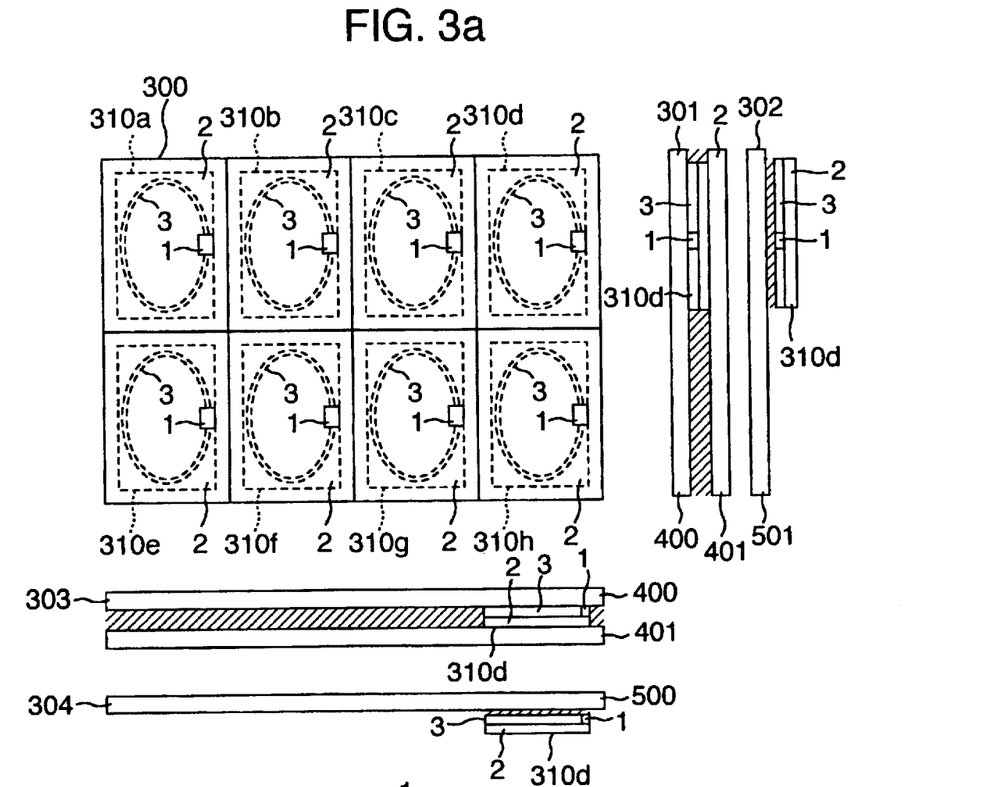
FIGS. 3a and 3b are views illustrating a such condition that a circuit using an electronic circuit chip is mounted on paper in a second embodiment of the present invention.

It is noted here that in the second embodiment, the capacitor 2 is manufactured, having a strength with which the capacitor cannot be folded. Further, as shown in the figures, the upper bottom surface (which is in parallel with the surface of the paper sheet) of the capacitor is set to a size which is slightly smaller than each of lattice spaces defined by section lines (one-dot chain lines shown in the figures) for sectioning the paper sheet in both longitudinal and lateral directions by (1/n) where n is an integer, and the sides of the paper sheet (the shape of each grid is not always rectangular), and the capacitor 2 is located at the center of any one of the lattice spaces.

In the example as shown, the lattice spaces are defined by section lines (one-dot chain lines as shown in the figure) sectioning the paper sheet into ½ in the longitudinal direction, and sectioning the paper sheet into ¼ in the lateral direction, and the sides of the paper sheet. The section lines defining the lattice spaces are set so that the creases in a certain folding configuration become the section lines if this folding configuration has been previously known. Further, if no folding configuration has not previously known, creases which are created in one of folding configurations which are usually used in accordance with a kind or use of the paper sheet are set as the section lines. That is, other than a special kind or use of the paper sheet, the positions of the section lines defining the lattice spaces are set at every 1/2, 1/3, ¼, 1/6, 1/8 or ¹⁄16 of the length of the paper sheet in either of the lateral and the longitudinal directions.

Figure 3B:
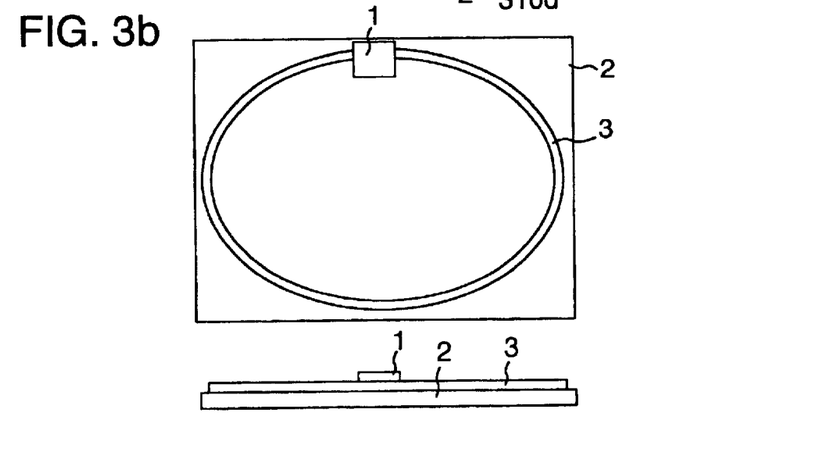

Further, in the second embodiment, as shown in FIG. 3*b* which is an enlarged view illustrating the circuit, the electronic circuit chip 1 is arranged on the capacitor which is manufactured so that its upper bottom surface (which is in parallel with the surface of the paper sheet) is larger than the electronic circuit chip 1, and accordingly, the upper bottom surface of the electronic circuit chip 1 is accommodated within the upper bottom surface of the capacitor 2 as viewed in a direction perpendicular to the surface of the paper sheet. With this arrangement, the capacitor 2 can protects the electronic circuit chip 1 against a force externally exerted. It is noted that if the upper bottom surface of the electronic circuit chip 1 is accommodated within the upper bottom surface of the capacitor 2 as viewed in a direction perpendicular to the surface of the paper sheet, the circuit may have such a structure that the antenna 3 is located between the capacitor 2 and the electronic circuit chip 1.

According to the second embodiment configured as mentioned above, since the paper sheet can hardly be folded in the part occupied by the capacitor 2, it can be expected that the paper sheet is never folded in the part occupied by the capacitor 2. Thus, the electronic circuit chip 1 located in the part occupied by the capacitor 2 can be expected to be prevented from being exerted thereto with a strong force externally applied. Further, the capacitor 2 is located at a position which does not hinder the folding of the paper sheet in a usual configuration, and accordingly, it is possible to present the convenience of the use of the paper from being greatly laurel.

Explanation will be hereinbelow made of a third embodiment of the present invention.

In the case of mounting the electronic circuit chip on a paper sheet, when a force is exerted to the paper sheet from the outside due to handling of the paper sheet, the force is also exerted to the paper sheet when the paper sheet is curved. In this embodiment, if the electronic circuit chip is planar (in a nearly rectangular parallelepiped), the electronic circuit chip which is designed satisfying conditions having been previously obtained in order to prevent the electronic circuit chip from being broken by a force externally exerted is mounted on the paper sheet.

Figure 4A:
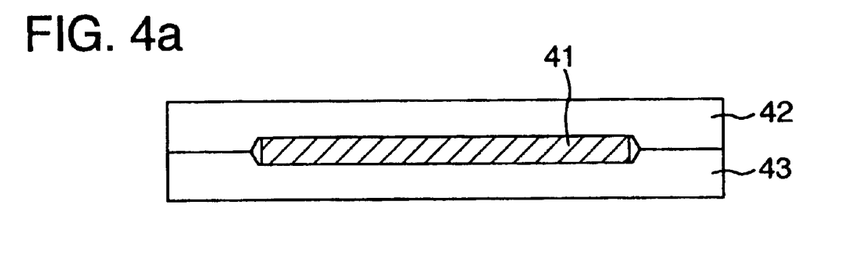
FIGS. 4a to 4d are sectional views illustrating such conditions that an electronic circuit chip are mounted on paper in a third embodiment of the present invention.
Figure 4B:
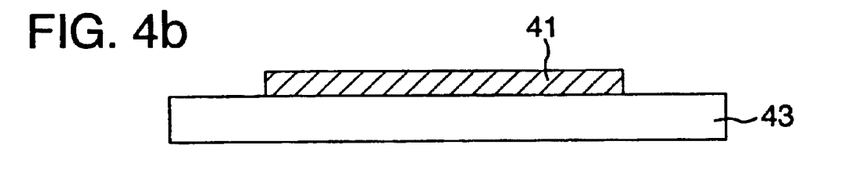
Figure 4C:
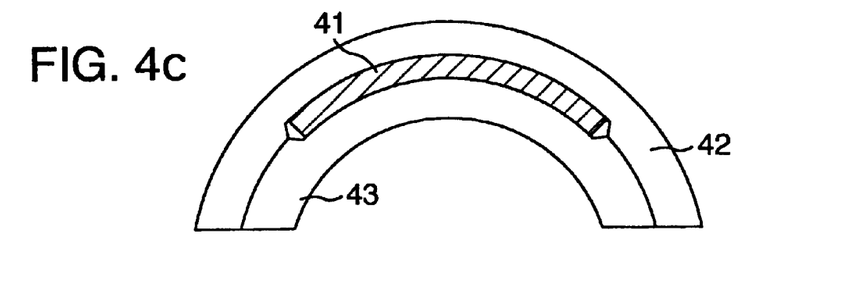
Figure 4D:
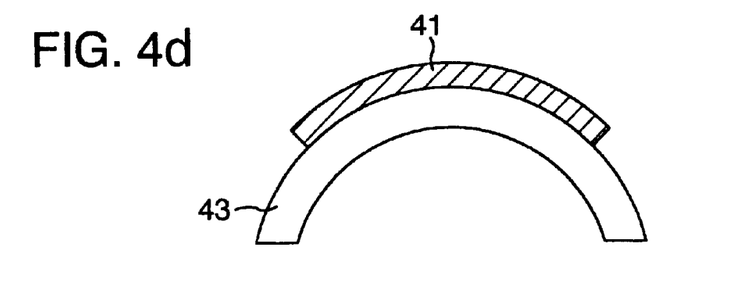

Referring to FIGS. 4a to 4d, there are shown electronic circuit chips 41 and paper sheets 42, 43. FIGS. 4a and 4c show an example in which the electronic circuit chip 41 is held between the sheets 42, 43 which are bonded together, FIG. 4a illustrating a condition in which no force is exerted to the paper sheet while FIG. 4c illustrates a condition in which a force is exerted to the paper sheet which is therefore curved. FIGS. 4b and 4d show in an example in which the electronic circuit chip 41 is bonded to the upper surface of the paper sheet 43, FIG. 4b illustrating a condition in which no force is exerted thereto while FIG. 4d illustrates a condition in which a force is exerted thereto so that the paper sheet is curved.

When a force and a moment are exerted to the paper sheet so that the long sides of the planar surface of the electronic circuit chip are curved, the force and the moment are effected in various positions on the electronic circuits chip. Estimating that one of the short sides of the planar surface of the electronic circuit chip is set as a fixed end while the other side on the opposite side is set as a free end, the force and the moment can be exhibited being substituted by the equally distributed loads exerted over the entire area of the planar surface, a concentrated load exerted to the free end, and a moment exerted to the free end. Even in such a case that the electronic circuit chip is held between the paper sheets, and also in such a case that it is bonded to the upper surface of the paper sheet, it is approximated to a similar configuration.

Figure 5:
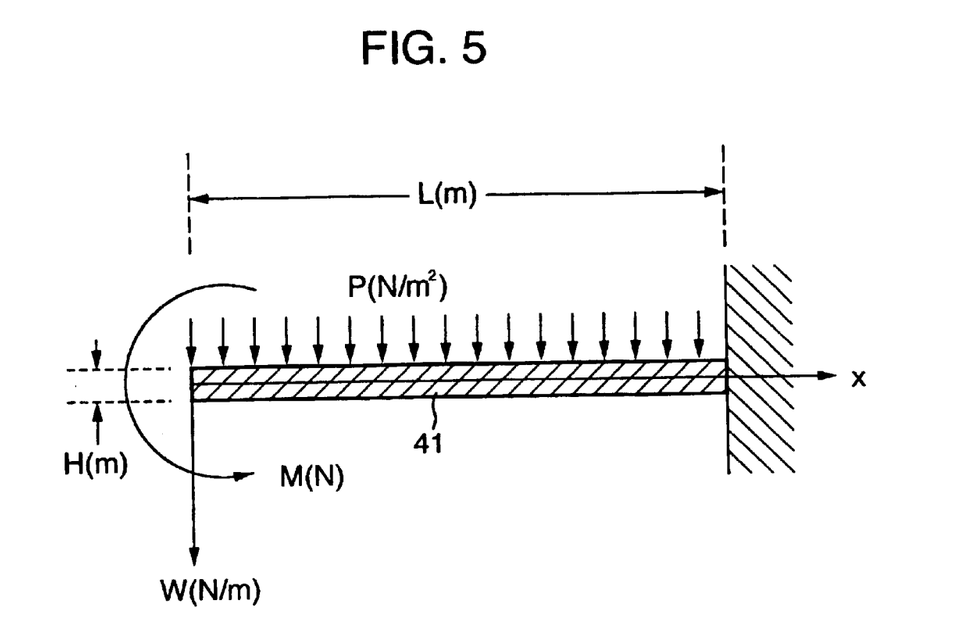
FIG. 5 is a view which approximately exhibits a force and a moment exerted so as to curve the electronic circuit chip in the third embodiment of the present invention.

Referring to FIG. 5 which is a view approximately exhibits a force and a moment which are exerted so as to curve the electronic circuit chip, a part indicated by rightward upward oblique lines exhibits a section of the electronic circuit chip 41, in parallel with the long sides of the planer surface thereof. The short sides of the planar surface of the electronic circuit chip 41 correspond to opposite ends of the section of the electronic circuit chip 41 in FIG. 4. Of these ends, the left end serves as the free ends while the right end serves as the fixed end. Referring to FIG. 4, the fixed part is exhibited by rightward downward oblique lines. Referring to this figure, there are shown a thickness H (m) of the electronic circuit chip 41, the length L (m) of the long sides of the electronic circuit chip, equally distributed loads P (N/m²) per unit area, which are exerted over the entire area of the planar surface of the electronic circuit chip 41, a concentrated load W (N/m) per unit length, exerted to the free end, and a bending moment M (N) per unit length, exerted to the free end.

The forces P and W and the moment M with which the electronic circuit chip 41 is curved, are estimated to be exerted within the section thereof, and a positive force or moment is taken in a direction in which the electronic circuit chip 41 is curved downward. In this embodiment the forces P and W and the moment M have positive values.

The x-axis is taken rightward from the free end as the origin. A moment per unit length, exerted to a position x (m) by the equally distributed loads P, is exhibited by $Px^2/2(N)$. A moment per unit length, exerted to a position x (m) by the concentrated load W is exhibited by Wx (N). A moment per unit length exerted by the bending moment M is exhibited by a constant value M(N), independent from the value x. Accordingly, the total value $M_{SUM}$ of the moments per unit length, exerted to the position x (m) is exhibited by $Px^2/2+Wx+M(N)$. x is taken in a range from o to L, and accordingly, $M_{SUM}$ becomes maximum at x=L, thus, $$M_{MAX}=PL^2/2+WL+M(N)$$

is obtained.

In this embodiment, since the shape of the electronic circuit chip can be approximated to a rectangular parallelepiped body, the bending stress exerted to the electronic circuit chip 41 becomes maximum at a position where the maximum bending moment is exerted, having a value $\sigma_{MAX}$ becomes $6M_{MAX}H^2(N/m^2)$.

If the bending strength of the electronic circuit chip 41 is denoted by $\sigma(N/m_2)$, since a condition with which the electronic circuit 41 can be prevented from being broken, is $\sigma \geq \sigma_{MAX}$, $$3PL^2+6WL+6M-\sigma H^2 \leq 0 \quad \text{(Formula 1)}$$

is obtained.

By solving the equation for L, H, σ, $$L \leq \{-W+(W^2-PA)^{1/2}\}/P \quad \text{(Formula 2)}$$

$$H \geq \{3(PL^2+2WL+2M)/\sigma\}^{1/2} \quad \text{(Formula 3)}$$

$$\sigma \geq (3PL^2+6WL+6M)/H^2 \quad \text{(Formula 4)}$$

are obtained. In the formula 2, A is $A=2M-\sigma H^2/3$.

As a condition with which the electronic circuit chip is prevented from being broken, the maximum value of the length L (m) of the long sides is obtained from the formula 2, the minimum value of the thickness H (m) is obtained from the formula 3, and the minimum value of the bending strength $\sigma(N/m^2)$ is obtained from the formula 4.

In an example, in such a case that the electronic circuit chip is mounted between the paper sheets, having a thickness with which the electronic circuit chip cannot be recognized even though the paper sheets are externally touched, the maximum thickness H (m) of the electronic circuit chip is determined. By co substituting a bending strength $\sigma(N/M^2)$ which can be obtained from the material quality and the shape of the electronic circuit chip, the equally distributed loads P (N/m²) per unit area and the concentrated load W(N/m) per unit length which are expected to be applied when paper is used, and the moment M (N) per unit length, into the formula 2, the maximum long side length L (m) with which the electronic circuit chip can be prevented from being broken can be obtained.

In another example, in such a case that the electronic circuit chip should have multiple functions, since the scale of the circuit becomes larger, the minimum value of the long side length L of the electronic circuit chip is determined. By substituting a bending strength σ(N/m²), the equally distributed loads P (N/m²) per unit area, and the concentrated load W(N/m) per unit length, and the moment M (N) per unit length, which are obtained similar to those as mentioned above, into the formula 3, the minimum thickness H (m) with which the electronic circuit chip can be prevented from being broken, can be obtained.

Thus, according to this embodiment, it is possible to provide an electronic circuit chip which can be prevented from being broken even though it is mounted to a soft material such as paper. Further, it is possible to provide a sheet on to which the electronic circuit chip designed as mentioned above is mounted.

Next, explanation will be hereinbelow made of a forth embodiment of the present invention.

In this embodiment, a tape like sheet on which electronic circuit chips are mounted, is used.

Figure 6:
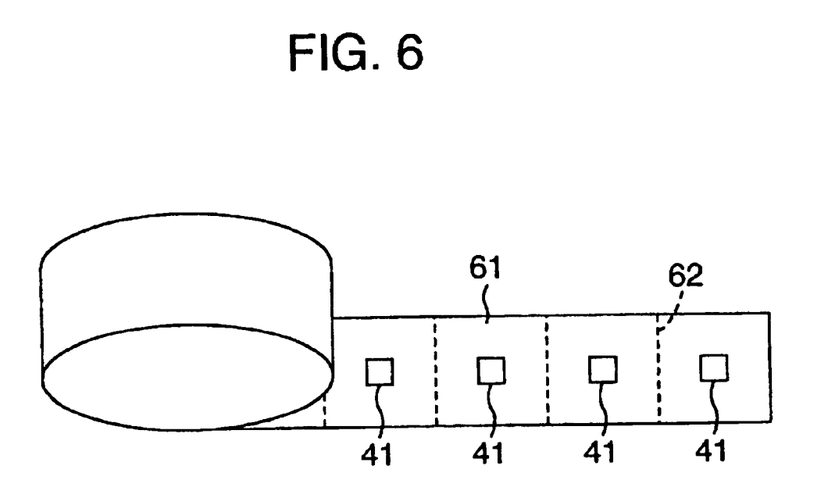
FIG. 6 is a view illustrating a tape on which electronic circuit chips are mounted.

Referring to FIG. 6, with the use of a tape-like sheet which can be rolled up, not only separated sheets as shown in planar sheets, but also a rolled continuous sheet can be provided.

A plurality of electronic circuit chips are mounted on an adhesive tape 61 at predetermined intervals. The adhesive tape is stocked in a rolled condition, and is used by being pulled by a required length. Perforations 62 are formed in the adhesive tape 61 so that a paper piece on which a single electronic circuit chip is mounted can be taken out therefrom.

According this embodiment, even though no electronic circuit chip has yet been mounted to a desired object, the electronic circuit part can be mounted to the object by cutting off a piece on which a single electronic circuit chip is mounted and then by bonding the same to the object.

According to this embodiment, an arbitrary object to which the adhesive tape 61 can be applied, can be mounted thereon with an arbitrary number of electronic circuit chips 41.

It is noted that although explanation has been made with the use of the adhesive tape 61 in this embodiment, a seal-like planer adhesive tape may be used, instead of the tape-like sheet.

Further, if a cut-off tape 61 can be applied to the object by another means, it is not required that the tape is adhesive.

Further, the electronic circuit chips should not be limited to one and the same kind, but various kinds of electronic circuit chip can be used.

Further, one and the same kind of electronic circuit chips 41 or a plural kinds of electronic circuit chips 41 may be cut off by a number which is not only one but more.

Industrially Usability

As mentioned above, according to the present invention, an electronic circuit chip can be mounted on a soft material such as paper while it can be prevented from being broken even though the material is bent or folded.

Further, according to the present invention, an electronic circuit chip can be simply mounted on the material at an arbitrary position.

What is claimed is:

1. A foldable sheet having a rectangular sheet surface, and mounted thereon with an electric circuit having a planar electronic circuit chip, a planar capacitor and an antenna, characterized in that the planar surface of the capacitor has a size which is slightly smaller than that of each of rectangular areas which are obtained by sectioning the sheet surface by n×m (where n and m are integers larger than 2), and the capacitor, the electronic circuit chip and the antenna are mounted on the sheet so that the planar surface of the capacitor and a planar surface of the electronic circuit chip are in parallel with the sheet surface, the planar surface of the capacitor is accommodated within one of the rectangular areas obtained by sectioning the sheet surface by n×m, as viewed in a direction perpendicular to the sheet surface, and the planar surface of the electronic circuit chip and the contour of the antenna are accommodated within the planar surface of the capacitor as viewed in a direction perpendicular to the sheet surface.

2. A planar electronic circuit chip mounted on a flexible sheet, characterized in that the electronic circuit chip has a thickness, a length of the long sides thereof, and a bending strength which satisfy:

$$3PL^2+6WL+6M-\sigma H^2<0$$

where a force exerted to the electronic circuit chip is exhibited by equally distributed loads P (N/M²) per unit area, exerted to a entire planar surface of the electronic circuit chip, and a concentrated load W (N/m) per unit length, is exerted to the free end, in such a case that one of the short sides of the planar surface of the electronic circuit chip is used as a fixed end while the other short side on the opposite side thereof is used as the free end, where a moment exerted to the electronic circuit chip is exhibited by a moment M (N) per unit length, exerted to the free end in such a case that one of the short sides of the planar surface of the electronic circuit chip is used as a fixed end while the other short side on the opposite side thereof is used as the free end, and where H (m) is the thickness of the electronic circuit chip;

L (m) is a length of the long sides of the electronic circuit chip; and

σ(N/m²) is a bending strength of the greater of a bending strength of another electric element larger than the electronic circuit chip mounted on the planar surface of the another electric element and the bending strength of the electronic circuit chip.

3. A sheet mounted thereon with an electronic circuit chip stated in claim 2.

4. A method of mounting a planar electronic circuit chip on a foldable sheet having a rectangular sheet surface together with another planar electric element, characterized by the steps of:

setting the planar surface of the another electric element to be slightly smaller than a size of each of the rectangular areas which are obtained by sectioning the sheet surface by n×m (where n and m are integers larger than 2), and mounting the another electric element and the electronic circuit chip on the sheet so that the planar surface of the another electric element and the planar surface of the electronic circuit chip are arranged in parallel with the surface of the sheet, the planar surface of the another electric element is accommodated within one of the rectangular areas which are obtained by sectioning the sheet surface by m×n, as viewed in a direction perpendicular to the sheet surface, and the planar surface of the electronic circuit chip is accommodated within the planar surface of the another electric element as viewed in a direction perpendicular to the sheet surface.

5. A method of mounting an electronic circuit chip as set forth in claim 4, characterized in that a long-rod like or a long planar like electric part is mounted on the sheet so that the longitudinal direction of the electric part is coincident with the sidewise direction of the sheet.

6. A method of mounting an electronic circuit chip as set forth in claim 4, characterized in that the sheet is made of paper.

7. A method of mounting an electronic circuit chip as set forth in claim 6, characterized in that the sheet has a two layer structure, and the electronic circuit chip is mounted between two layers of the sheet.

8. A method of mounting an electronic circuit chip as set forth in claim 6, characterized in that the electronic circuit chip is mounted on the surface of one of two front and rear sheet surfaces of the sheet.

9. A method of mounting an electronic circuit chip as set forth in claim 4, characterized in that the sheet is tape-like.

* * * * *

UNITED STATES PATENT AND TRADEMARK OFFICE
CERTIFICATE OF CORRECTION

| | | |
|---|---|---|
| PATENT NO. | : 6,731,509 B2 | Page 1 of 1 |
| APPLICATION NO. | : 09/856758 | |
| DATED | : May 4, 2004 | |
| INVENTOR(S) | : Okamoto et al. | |

It is certified that error appears in the above-identified patent and that said Letters Patent is hereby corrected as shown below:

On the Title page

Item (75) Inventors:

"Asahiko Sobe" should read --Asahiko Isobe--.

Signed and Sealed this

Thirteenth Day of April, 2010

David J. Kappos
*Director of the United States Patent and Trademark Office*